(12) United States Patent
Hishiki et al.

(10) Patent No.: US 9,735,096 B1
(45) Date of Patent: Aug. 15, 2017

(54) LEAD FRAME AND METHOD FOR MANUFACTURING THE SAME

(71) Applicant: SH MATERIALS CO., LTD., Tokyo (JP)

(72) Inventors: Kaoru Hishiki, Kagoshima (JP); Yasuo Toyoshi, Kagoshima (JP)

(73) Assignee: SH MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/504,404

(22) PCT Filed: Jul. 30, 2015

(86) PCT No.: PCT/JP2015/071644
§ 371 (c)(1),
(2) Date: Feb. 16, 2017

(87) PCT Pub. No.: WO2016/031482
PCT Pub. Date: Mar. 3, 2016

(30) Foreign Application Priority Data

Aug. 26, 2014 (JP) .................................. 2014-171974

(51) Int. Cl.
*H01L 23/495* (2006.01)
*H01L 33/62* (2010.01)
*H01L 21/48* (2006.01)

(52) U.S. Cl.
CPC .... *H01L 23/49582* (2013.01); *H01L 21/4828* (2013.01); *H01L 23/49503* (2013.01); *H01L 23/49548* (2013.01); *H01L 33/62* (2013.01)

(58) Field of Classification Search
CPC ........... H01L 23/49582; H01L 21/4828; H01L 23/49503; H01L 23/49548; H01L 33/62; H01L 257/676; H01L 23/49506; H01L 23/4951; H01L 23/49513
See application file for complete search history.

(56) References Cited

U.S. PATENT DOCUMENTS

| 5,343,073 A | 8/1994 | Parthasarathi et al. |
| 5,449,951 A | 9/1995 | Parthasarathi et al. |
| 2013/0307000 A1* | 11/2013 | Ikenaga ................ H01L 33/486 257/91 |

FOREIGN PATENT DOCUMENTS

| JP | 7-503103 | 3/1995 |
| JP | 2001-342580 | 12/2001 |
| JP | 2002-270740 | 9/2002 |
| JP | 20085-226096 | 8/2005 |
| JP | 2013-153032 | 8/2013 |
| WO | 93/14518 | 7/1993 |

OTHER PUBLICATIONS

International Search Report issued Oct. 20, 2015 in International (PCT) Application No. PCT/JP2015/071644.

* cited by examiner

*Primary Examiner* — Walter H Swanson
(74) *Attorney, Agent, or Firm* — Wenderoth, Lind & Ponack, L.L.P.

(57) ABSTRACT

A metal plate 1 to be a lead frame has a plating with Sn or Zn or a plating with various alloys containing these metals only on the side faces and half-etched faces 6, and a noble metal plating layer formed on the front surface as a surface on which a semiconductor device is to be mounted.

6 Claims, 2 Drawing Sheets

FIG.2

| | EXAMINATION OBJECT | FILM THICKNESS (μm) | RESIN ADHESION STRENGTH (MPa) |
|---|---|---|---|
| EMBODIMENT 1 | Zn | 1 | 23 |
| EMBODIMENT 2 | Zn | 0.2 | 23 |
| EMBODIMENT 3 | Sn | 1 | 19 |
| EMBODIMENT 4 | ZnNi | 1 | 19 |
| EMBODIMENT 5 | NiP | 1 | 19 |
| COMPARATIVE EXAMPLE 1 | - | - | 10 |
| COMPARATIVE EXAMPLE 2 | (COPPER ROUGHENING) | - | 13 |
| COMPARATIVE EXAMPLE 3 | Ag | 0.2 | 12 |

…
LEAD FRAME AND METHOD FOR MANUFACTURING THE SAME

TECHNICAL FIELD

The present invention relates to a lead frame and a method for manufacturing the same, and more particularly to a lead frame good in adhesion to resin.

BACKGROUND ART

Metallic lead frames and sealing resins are mainly used for semiconductor packages, where copper alloys are frequently used for the lead frames and epoxy resins are the mainstream of the sealing resins.

In addition, for heat dissipation of a semiconductor package, a copper plate or a copper alloy plate is sometimes used as a material of a component called a heat spreader, and the lead frame and the heat spreader are fixed with a sealing resin.

In a product in which metal materials using copper and a copper alloy and a resin are joined in such a way, the adhesion often comes to be an issue, and as measures for improving the resin adhesion, methods for roughening treatment of the surfaces of the lead frame and the heat spreader are adopted for attaining the anchor effect.

However, the problem in these methods is in that, in a semiconductor package of the QFN (Quad Flat Non-Lead) type for example, the connection terminals are uncovered on the lower surface of the sealing resin, and roughening treatment of the lower surface of the metallic material may cause leakage of the resin, whereas the roughening treatment makes it difficult to peel off the leaked resin. Therefore, conventionally, there have been proposed methods for making roughening treatment locally, but these processing methods involve the problem of increased cost.

Further, since high-temperature heating of the copper material progresses copper oxidation on the roughened surface to easily cause the oxide film to peel off and decreases the resin adhesion as compared with before heating, the roughening treatment of the copper material therefore has not yet obtained sufficient reliability for a semiconductor package.

Conventionally, the art shown in Patent Document 1, Patent Document 2, and Patent Document 3 have been disclosed as alternatives to these roughening treatments.

Patent Document 1 discloses, as a method for improving the adhesion between a heat sink and a resin adhesive in the heat sink of an electronic component such as a semiconductor device, immersing in a solution containing 0.001% or more of an aminosilane compound a metal plate or strip material with Ni or Ni alloy plating, to form an aminosilane compound coating on the outermost surface of a portion that is to be bonded to the resin with the adhesive.

Patent Document 2 discloses forming a nickel plating layer on a copper plate as a substrate, forming thereon a coating layer of silane coupling agent or a polyacrylic acid film to make the outcome as a heat sink for a semiconductor, bonding thereto a semiconductor element and a printed circuit board, and sealing the semiconductor element with a transfer molding resin, to obtain a heat sink for a semiconductor excellent in adhesion to adhesive resin.

Patent Document 3 discloses a copper or copper alloy plate or strip in which a silane compound coating of 0.5 mg/m$^2$ or more in terms of Si adhered amount is formed on the outermost surface and an oxide film having a thickness of 1000 to 2000 Å is formed on the layer beneath, wherein aqueous solution of silane coupling agent at 40° C. to 60° C. is applied to the surface of the copper or copper alloy plate or strip to form the silane compound coating on the surface and then heat treatment is made to form the oxide film of the copper or copper alloy plate or strip with the thickness of 1000 to 2000 Å on the layer beneath the silane compound coating, thereby to obtain a copper alloy plate or strip material excellent in adhesion to resin.

The surface treatment of copper and copper alloy strips by these conventional chemical method makes it difficult to sufficiently improve the adhesion to the resin, and a technique for improving the adhesion between the lead frame and the resin is still required.

PRIOR ART DOCUMENTS

Patent Documents

Patent Document 1: JP Patent Laid-Open (TOKKYO KOKAI) No. 2001-342580

Patent Document 2: JP Patent Laid-Open (TOKKYO KOKAI) No. 2002-270740

Patent Document 3: JP Patent Laid-Open (TOKKYO KOKAI) No. 2005-226096

SUMMARY OF THE INVENTION

Problems to be Solved by the Invention

As another measure for improving the adhesion to the resin, there is a method of treating the surface of a copper material with Sn or its alloy plating, Zn or its alloy plating.

In this case, the entire material surface is first plated with Sn, Zn or various alloys containing these metals, then the plated surface is masked with DFR, and then etching is performed to manufacture a desired lead frame. As a result, there is formed a lead frame in which a material surface not etching-dissolved is plated with Sn, Zn or various alloys containing these metals and etching-dissolved faces do not undergo plating treatment with Sn, Zn, or various alloys containing these metals.

Alternatively, there is a method in which plating with Sn, Zn or various alloys containing these metals is applied to a lead frame having been formed by etching or press, to subject the entire frame to plating treatment with Sn, Zn or various alloys containing these metals. In this case, etching-dissolved faces and press-cut faces also are totally subjected to plating treatment with Sn, Zn or various alloys containing these metals.

As described above, since the original surface of the material is plated with Sn, Zn or various alloys containing these metals according to either of the methods, for example in the case of lead frames for illumination use such as LEDs, which are required to have a gloss on the material surface, plating of the material surface with Sn, Zn or various alloys containing these metals causes diffusion of light at the material surface, to result in a failure in assuring necessary glossiness.

For this reason, in the case of lead frames for illumination use such as LEDs, plating treatment with Sn, Zn or various alloys containing these metals could not be performed even if improvement of adhesion to the resin was desired.

Further, while a lead frame is improved in resin adhesion by plating treatment with Sn, Zn or various alloy containing these metals, it has remarkably deteriorated in wire bondability in comparison with a material surface of a lead frame not subjected to plating with Sn, Zn or various alloys containing these metals.

Therefore, even lead frames that are essentially desired to be subjected to plating treatment with Sn, Zn or various alloys containing these metals in some cases cannot be plated with Sn, Zn or various alloys containing these metals.

In view of the above circumstances, an object of the present invention is to provide, for example in the case of being applied to an LED required to have a gloss on the material surface, a lead frame that can achieve improved adhesion to the resin without losing a surface gloss or deteriorating wire bondability, even if being subjected to plating treatment with Sn, Zn or various alloys containing these metals, and a manufacturing method therefor.

Measures to Solve the Problems

To attain the above-mentioned object, in a lead frame of the present invention, a plating layer of Sn, Zn or various alloys containing these metals such as ZnNi, SnBi, SnCu, and SnB is formed only on side faces and half-etched faces of the lead frame.

In that case, the thickness of the plating layer of Sn, Zn or various alloys containing these metals is 0.02 to 2.0 µm.

Further, according to the present invention, a noble metal plating layer is formed on the front surface of the lead frame, as a surface on which a semiconductor element or an LED element is to be mounted, and the metal plate is uncovered on the remaining faces.

In that case, the noble metal plating layer is formed of Ni (or Ni alloy)/Pd (or Pd alloy), Ni (or Ni alloy)/Pd (or Pd alloy)/Au (or Au alloy), Ni (or Ni alloy)/Pd (or Pd alloy)/Au (or Au alloy)/Ag (or Ag alloy), Ni (or Ni alloy)/Pd (or Pd alloy)/Ag (or Ag alloy)/Au (or Au alloy), Cu (or Cu alloy)/Ag (or Ag alloy) overlaid one after another in this order.

A method for manufacturing a lead frame according to the present invention includes: a step of forming a plating mask with a resist on a metal plate that is a lead frame material; a step of forming a plating on a part of the metal plate left uncovered with the plating mask; a step of covering the plated portion with a resist to form an etching mask for obtaining a required lead frame shape; a step of subjecting the metal plate to through-hole work and half-etching work by etching; and a step of plating through-hole faces and half-etched faces worked by the etching with Sn, Zn or various alloys containing these metals.

Further, according to the present invention, the plating with Sn, Zn or various alloys containing these metals preferably is electroplating, but any other plating can be used as long as it is a plating capable of forming a film such as chemical plating or vacuum vapor deposition. Also, in the lead frame of the present invention, the thickness of the plating suitably is about 0.02 to 2.0 µm. This is because the effect is insufficient when the thickness of the plating is 0.02 µm or less, whereas a plating thickness of 2.0 µm or more does not enhance the effect of the plating.

Effect of the Invention

According to the present invention, the plating treatment is locally performed using Sn, Zn, or various alloys containing these metals solely on etching-dissolved faces (product-side surface and half-etched portions), so that the adhesion between the frame and the resin can be much improved.

That is, for a lead frame required to have a surface gloss, it was not feasible, conventionally, to perform plating treatment with Sn, Zn or various alloys containing these metals, because, if plating with Sn, Zn, or various alloys containing these metals should be applied all over to the material surface, a surface glossiness after plating could not be assured as well as the wire bondability would be remarkably degraded owing to the influence of the plating with Sn, Zn or various alloys containing these metals. However, by applying the local plating with Sn, Zn or various alloys containing these metals according to the present invention, even in a case of a lead frame for illumination such as a LED, since only the etching-dissolved faces are plated with Sn, Zn or various alloys containing these metals, it is possible to improve the adhesion between the lead frame and the reflector resin without affecting the glossiness after plating.

In addition, for QFN-type lead frames and other IC lead frames also, local plating with Sn, Zn or various alloys containing these metals can improve the resin adhesion. Not only by plating the product-side surface, which is an etching-dissolved face, with Sn, Zn, or various alloys containing these metals but also by adding half-etched faces in the front surface or increasing the area of an existing half-etched face, the area of plating with Sn, Zn or various alloys containing these metals is increased, to improve the resin adhesion. Regarding a tapeless QFN also, the resin adhesion can be improved, because the terminal-side surface is subjected to plating treatment with Sn, Zn or various alloys containing these metals.

In addition, conventionally, when improvement of the resin adhesion is intended by roughening treatment or the like of a copper surface, copper oxidation on the roughened surface progresses due to aging, heat treatment by assembly and the like, so that oxide film peeling is likely to occur and the resin adhesion often is deteriorated. According to the method of the present invention, oxide films of Sn, Zn or various alloys containing these metals formed by aging, heat treatment and the like improve adhesion to the resin. In addition, these oxide films are not deteriorated in resin adhesion by heating or the like.

Furthermore, in order to perform local plating with Sn, Zn, or various alloys containing these metals, a mask for plating with Sn, Zn, or various alloys containing these metals is required. However, according to the present invention, since the mask for etching is used as it is also as a mask for plating with Sn, Zn or various alloys containing these metals, it is possible to continuously perform plating treatment with Sn, Zn or various alloys containing these metals from the etching process by the same apparatus, and thus even a lead frame subjected to local plating with Sn, Zn or various alloys containing these metals can be produced at low cost.

In addition, according to the method of the present invention, regarding the shape and design of the lead frame, it is possible, regardless of the application (LED, IC), to locally add half-etched portions or to increase the area of existing half-etched portions, so that the area for plating treatment with Sn, Zn or various alloys containing these metals is increased and the resin adhesion is further improved.

BRIEF DESCRIPTION OF THE DRAWINGS

FIGS. 1A-I are views that show steps of the method for manufacturing a lead frame according to a first embodiment of the present invention, in which FIG. 1A is a view in which a resist layer is formed on a metal plate, FIG. 1B is a view in which a plating mask is formed, FIG. 1C is a view in which a plating layer is formed, FIG. 1D is a view in which the plating mask is peeled off, FIG. 1E is a view in which a resist layer is formed on both surfaces of the metal plate which has been plated, FIG. 1F is a view in which an etching mask is formed, FIG. 1G is a view after etching, FIG. 1H is a view in which plating treatment with Sn, Zn or various alloys containing these metals is locally carried out using the etching mask, and FIG. 1I is a view in which the etching mask is peeled off.

FIG. 2 is a table that shows evaluation results of resin adhesion strength of test pieces prepared in Embodiments and Comparative Examples.

MODE FOR CARRYING OUT THE INVENTION

Hereinafter, a method for manufacturing a lead frame according to the present invention will be described with reference to FIGS. 1A-I.

A first step is the step of: forming a photoresist layer 2 by laminating a photoresist on the front and back surfaces of a metal plate 1 to be a lead frame material, putting on the photoresist layer 2 a plating mask 3 that carries a plating pattern, and drawing the plating pattern by transferring it to the resist through a photolithography process (exposure and development).

Figure 1A:
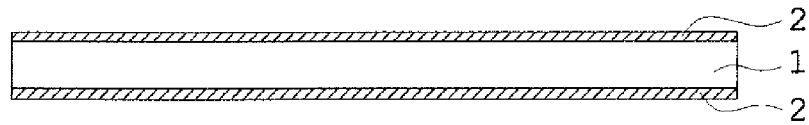
Figure 1B:
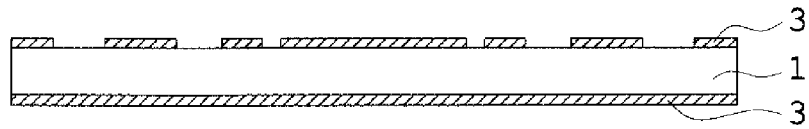
Figure 1C:
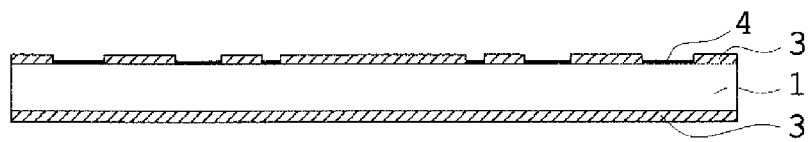
Figure 1D:
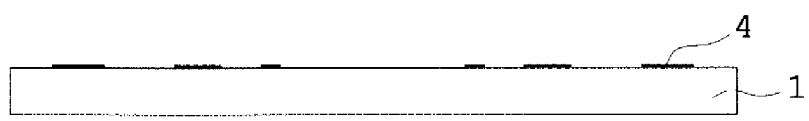
Figure 1E:
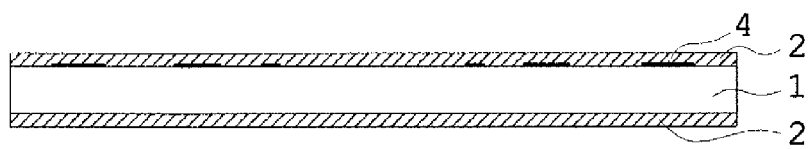
Figure 1F:
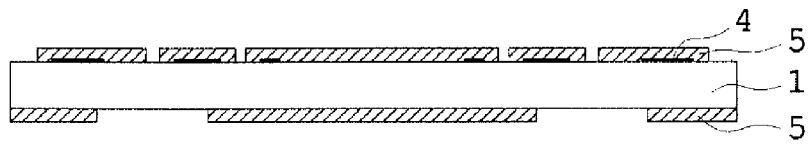

This step includes: laminating a photoresist (for example, a dry film resist) on the metal plate 1 (FIG. 1A), transferring a glass mask that carries a plating pattern to the resist through a photolithography process (exposure and development), to draw the plating pattern on the metal plate 1 (FIG. 1B), and then applying Ni/Pd/Au or Ag plating 4 by electrolytic plating, to form Ni/Pd/Au or Ag coating (FIG. 1C).

Figure 1G:
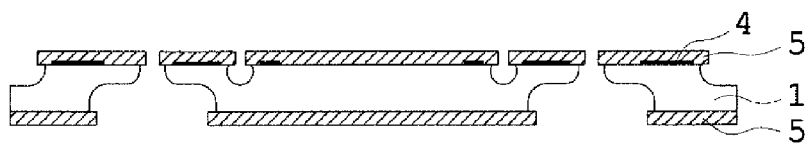

Next is: peeling off the plating mask 3 formed on the both surfaces of the metal plate 1 with an aqueous solution of sodium hydroxide (FIG. 1D), and then laminating a photoresist again on the metal plate 1 (FIG. 1E), transferring a glass mask that carries a lead frame pattern to the resist through a photolithography process (exposure and development) (FIG. 1F), and removing unnecessary metal portions by etching using a ferric chloride solution, to form a lead frame shape (FIG. 1G).

Figure 1H:
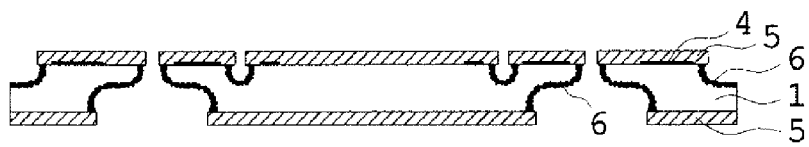
Figure 1I:
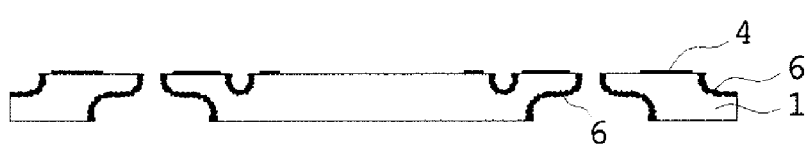

Next is performing Sn or Zn plating treatment by electrolytic plating (FIG. 1H). As a result, Sn or Zn plating is applied with a thickness of 0.02 to 2.0 μm only to the etching-dissolved faces (side faces and half-etched portions of the metal plate 1).

Finally, peeling off the etching mask formed on the both surfaces of the metal plate 1 with an aqueous solution of sodium hydroxide makes the lead frame (FIG. 1I) according to the present invention.

In this way, the present invention can provide a lead frame with an improved adhesion to the sealing resin and a wire bondability equivalent to that of the conventional one. According to the present invention, a copper-based material is preferable as the material of the metal plate 1, but it is not limited thereto.

Embodiment 1

Using a copper material having a thickness of 0.150 mm as the metal plate 1, a dry film resist (Asahi Kasei E-Materials Co., Ltd.: AQ-2058) was affixed to the both surfaces to form a resist layer. Then, by performing exposure and development using a glass mask for the upper surface side and the rear surface side on which a pattern for forming the plating is formed, the resist in the portions for plating is removed, to thereby form a plating mask that leaves the metal plate surface partially uncovered.

Next, a plating process was performed to form a plating on the uncovered portions of the metal plate surface. In this embodiment, Ni plating with a set value of 1.0 μm, Pd plating with a set value of 0.02 μm, and Au plating with a set value of 0.007 μm were applied in order from the metal plate side, to form a three-layered plating.

Next, the plating masks formed on both sides of the metal plate were peeled off with a 3% sodium hydroxide aqueous solution, and washing treatment with a 3% sulfuric acid was also carried out.

Next, a dry film resist (Asahi Kasei E-Materials Co., Ltd.: AQ-44096) was affixed to the both sides of the plated metal plate to form a resist layer, and a glass mask carrying a lead frame shape was used. And both surfaces were exposed and developed to form an etching mask.

Next, a spray etching process was performed using a ferric chloride solution to form a lead frame. In the etching process, a ferric chloride solution having a liquid temperature of 70° C. and a specific gravity of 1.47 was used, to be sprayed at a set pressure of 0.3 MPa by a swinging spray nozzle for about 160 seconds of the treatment.

Next, after removal of copper crystals, which had adhered to the etching-dissolved faces, by washing with sulfuric acid via spraying, Zn plating treatment was performed by electrolytic plating method. This electric Zn plating bath contained 5 g/l of NaOH, 35 g/l of NaCN and 230 g/l of Zn(CN), and electric Zn plating was carried out at a current density of 3 A/dm$^2$, to obtain a Zn plating layer with a film thickness of 1 μm.

Next, the residue of the Zn plating treatment liquid, which had adhered to the Zn plating surface, was removed by washing with hydrochloric acid via spraying, and then the etching mask was peeled off using an aqueous solution of sodium hydroxide. Thereafter, acid treatment with sulfuric acid was carried out to dry the surface, thereby obtaining a lead frame of Embodiment 1 in which the product side surface and the etching-dissolved faces were locally Zn-plated.

Embodiment 2

A lead frame of Embodiment 2 was obtained in the same manner as in Embodiment 2 except that the film thickness of the electric Zn plating was 0.2 μm.

Embodiment 3

A lead frame of Embodiment 3 was obtained in the same manner as in Embodiment 1 except that Sn plating was applied instead of Zn. This electric Sn plating bath contained 55 g/l of stannous sulfate, 100 g/l of sulfuric acid, 60 g/l of cresolsulfonic acid, 2 g/l of gelatin, and 1 g/l of β-naphthol, and an electric Sn plating was carried out at a current density of 2 A/dm$^2$, to obtain a Sn plating layer with a film thickness of 1 μm.

Embodiment 4

A lead frame of Embodiment 4 was obtained in the same manner as in Embodiment 1 except that ZINNY ST AF 210 zinc nickel alloy plating (Ni codeposition rate 12-15 wt %) manufactured by Atotech Co., Ltd., was applied to the Zn plating. ZINNY ST AF 210 zinc nickel alloy plating was a plating bath composed of a basic solution that contained 213 g/l of potassium chloride, 42 g/l of zinc chloride and 121 g/l of nickel chloride hexahydrate and, as additives, 10 ml/l of ZINNY ACAF 211, 10 ml/l of ZINNY ACAF 212, 20 ml/l of ZINNY ACAF 214, and 70 ml/l of ZINNY ACAF 216, and electric plating was carried out at a current density of 2 A/dm$^2$, to obtain a ZnNi alloy plating layer with a film thickness of 1 μm.

Embodiment 5

A lead frame of Embodiment 5 was obtained in the same manner as in Embodiment 1 except that NiP plating was applied instead of Ni. This electric NiP plating bath was contains 250 g/l of nickel sulfate, 50 g/l of nickel chloride, 50 g/l of boric acid and 30 ml/l of Novoplate HS (Atotech Japan Kabushiki Kaisha) and electric Sn plating was carried out at a current density of 2 A/dm$^2$, to obtain a NiP plating layer with a film thickness of 1 μm.

Although the embodiments have been described above, the present invention is not limited by these embodiments.

Comparative Example 1

A lead frame of Comparative Example 1 was obtained in the same manner as in Embodiment 1 except that Zn plating was not applied after etching.

Comparative Example 2

A lead frame of Comparative Example 2 was obtained in the same manner as in Embodiment 1 except that copper roughening treatment was performed instead of Zn plating after etching. The copper roughening treatment was carried out by spraying a roughening treatment liquid (Mech Co., Ltd.: CZ 8100). Upon this roughening treatment liquid being conditioned to a liquid temperature of 35° C., a specific gravity of 1.145, and a copper concentration of 35 g/L, roughening treatment was performed by spraying. The surface roughness of the roughened surface was SRa 0.2-0.4.

Comparative Example 3

A lead frame of Comparative Example 3 was obtained in the same manner as in Embodiment 1 except that Ag plating was applied instead of Zn plating. The Ag plating bath contains 40 g/l of KCN, 35 g/l of AgCN and 22 g/l of K$_2$CO$_3$, and Ag electroplating was carried out at a current density of 3 A/dm$^2$, to obtain an Ag plating layer with a film thickness of 0.2 μm.

test pieces for the resin adhesion evaluation test was cut out from the lead frames thus formed.

In order to judge the resin adhesion of these test pieces, the resin adhesion strength was evaluated by the following method. That is, on a metal base material, four pieces of the resin having a diameter of 2 mm were formed under the conditions of a metal injection pressure of 100 kg/cm$^2$ and a metal mold temperature of 175° C. for 90 seconds, and the pieces of resin were heated in an oven at 175° C. for 8 hours And subjected to curing treatment to form four samples for evaluation. Each of the resin samples for evaluation was pushed right from the side, and the load at the time when the resin peeled off was measured. This value was divided by the adhesion area of the resin and converted into the load per unit area. The average of the loads of the four samples thus obtained was taken as the resin adhesion strength.

As a result of evaluation of resin adhesion strength for each of the lead frames produced according to Embodiments and Comparative Examples as described above, as shown in FIG. 2, the resin adhesion strength was 23 MPa regarding the lead frame of Embodiment 1, 23 MPa also regarding the lead frame of Embodiment 2, 19 Mpa regarding the lead frame of Embodiment 3, 19 Mpa regarding the lead frame of Embodiment 4, 19 Mpa regarding the lead frame of Embodiment 5, 10 Mpa regarding the lead frame of Comparative Example 1, 13 MPa regarding the lead frame of Comparative Example 2, and 12 MPa regarding the lead frame of Comparative Example 3.

From these results, it was confirmed that if Sn or Zn plating was applied only to the product-side surface and the half-etched faces, adhesion strength about twice that in the case where Sn or Zn plating was not applied was achieved. Further, when the plating thickness of Zn was in the range of 0.2 to 1 μm, the adhesion strength did not change and was at a sufficiently high level. In addition, it was found that high adhesion strength like Sn or Zn plating cannot be obtained when copper roughening treatment or Ag plating was performed instead of Sn or Zn plating.

On the other hand, even when ZnNi plating or NiP plating was performed, it was found that high adhesion strength as high as that of Sn or Zn plating can be achieved.

DESCRIPTION OF THE REFERENCE SYMBOLS

1 . . . metal plate
2 . . . resist layer
3 . . . plating mask
4 . . . plating
5 . . . etching mask
6 . . . surface treated with Sn or Zn plating

The invention claimed is:

1. A lead frame made of a metal plate, wherein a plating of Sn, Zn or various alloys containing these metals, including ZnNi, SnBi, SnCu and SnB, is formed only on side faces and half-etched faces of the lead frame.

2. The lead frame according to claim 1, wherein a thickness of the plating of any of the various alloys is 0.02 to 2.0 μm.

3. The lead frame according to claim 1, wherein a noble metal plating layer is formed on a lead frame surface on which a semiconductor element or an LED element is to be mounted.

4. The lead frame according to claim 3, wherein the noble metal plating layer is formed of Ni (or Ni alloy)/Pd (or Pd alloy), Ni (or Ni alloy)/Pd (or Pd alloy)/Au (or Au alloy), Ni (or Ni alloy)/Pd (or Pd alloy)/Au (or Au alloy)/Ag (or Ag alloy), Ni (or Ni alloy)/Pd (or Pd alloy)/Ag (or Ag alloy)/Au (or Au alloy), Cu (or Cu alloy)/Ag (or Ag alloy) overlaid one after another in this order.

5. The lead frame according to claim 3, wherein, other than the lead frame surface on which the noble metal layer is formed, faces of the metal plate are left uncovered.

6. A method for manufacturing a lead frame comprising:
a step of forming a plating mask of a resist on a metal plate that is a material of the lead frame;
a step of plating the metal plate left uncovered with the plating mask;
a step of forming an etching mask of a resist, to cover the plated portion for attaining a required shape of the lead frame;
a step of subjecting the metal plate to through-hole work and a half-etching work by etching; and a step of plating through-hole faces and half-etched faces worked by etching with Sn, Zn or various alloys containing these metals.

* * * * *